(12) United States Patent
Hikita et al.

(10) Patent No.: US 6,285,084 B1
(45) Date of Patent: Sep. 4, 2001

(54) SEMICONDUCTOR DEVICE

(75) Inventors: Junichi Hikita; Hiroo Mochida, both of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/499,581

(22) Filed: Feb. 7, 2000

(30) Foreign Application Priority Data

Feb. 9, 1999 (JP) .................................................. 11-031711

(51) Int. Cl.$^7$ ........................... H01L 23/48; H01L 23/52; H01L 29/40
(52) U.S. Cl. ............................... 257/777; 257/80; 257/82; 257/81
(58) Field of Search ..................................... 257/777, 723, 257/724, 686, 80, 81, 84, 82, 91, 99

(56) References Cited

U.S. PATENT DOCUMENTS

| | | | |
|---|---|---|---|
| 4,851,695 | * | 7/1989 | Stein . |
| 4,888,625 | * | 12/1989 | Mueller . |
| 5,226,052 | * | 7/1993 | Tanaka et al. . |
| 5,654,559 | * | 8/1997 | Spaeth et al. . |
| 6,005,262 | * | 12/1999 | Cunningham et al. . |
| 6,057,598 | * | 5/2000 | Payne et al. . |
| 6,175,157 | * | 1/2001 | Morfuji . |
| 6,198,136 | * | 3/2001 | Voldman . |

* cited by examiner

Primary Examiner—Sheila V. Clark
(74) Attorney, Agent, or Firm—Rader, Fishman & Grauer

(57) ABSTRACT

A semiconductor device is including a first semiconductor chip, and a second semiconductor chip stacked on the first semiconductor chip and bonded to a surface of the first semiconductor chip. The first semiconductor chip and the second semiconductor chip are formed with a first element and a second element, respectively, which are provided in an opposed relation and adapted to be coupled to each other in an electrically isolated state for signal transmission. The first semiconductor chip has an external connector isolated from the first element and electrically connected to the second element. The first semiconductor chip may have a protective circuit for prevention of insulation breakdown between the first element and the second element. Further, the first semiconductor chip may have an insulating film provided on a surface of a semiconductor substrate thereof, and a wiring for connection between the external connector and the second element may be provided on a greatest thickness region of the insulating film.

16 Claims, 7 Drawing Sheets

SEMICONDUCTOR DEVICE

BACKGROUND OF THE INVENTION

1. Field of the Invention

The present invention relates to a semiconductor device having a pair of elements which are adapted to be coupled to each other in an electrically isolated state for signal transmission.

2. Description of Related Art

Devices having a transmitter element and a receiver element in pair which are adapted to be optically or magnetically coupled to each other in an electrically isolated state for signal transmission are generally referred to as isolators. Exemplary isolators are photo-couplers which include a light-emitting element such as a light-emitting diode and a light-receiving element such as a photo MOS transistor or a photo diode.

Typical constructions of the conventional photo-couplers, which are described in NIKKEI ELECTRONICS Jul. 1, 1991, pp83–92, are respectively shown in FIGS. 8 and 9. FIG. 8 illustrates a photo-coupler of opposed type in which a semiconductor chip 110 formed with a light-emitting element is opposed to a semiconductor chip 120 formed with a light-receiving element. FIG. 9 illustrates a photo-coupler of planar type in which a semiconductor chip 110 formed with a light-emitting element and a semiconductor chip 120 formed with a light-receiving element are disposed in substantially the same plane.

In either of the photo-diodes, the semiconductor chips 110, 120 are mounted on different lead frames 111, 121, and a transparent resin 101 is interposed between the semiconductor chips 110 and 120 to provide a light path therebetween. In this state, the semiconductor chips 110, 120 are encapsulated with a mold resin in a package 103, and distal edges of the lead frames 111, 121 are led out of the package 103.

In the case of the opposed type, light is transmitted through the transparent resin 101 between the opposed semiconductor chips 110 and 120, and direct light from the light-emitting element of the semiconductor chip 110 is incident on the light-receiving element of the semiconductor chip 120. In the case of the planar type, on the other hand, light emitted from the light-emitting element of the semiconductor chip 110 is reflected on an interface between the transparent resin 101 and the mold resin, and the reflected light is incident on the light-receiving element of the semiconductor chip 120.

Since the aforesaid photo-couplers are constructed such that the light-emitting element and the light-receiving element are resin-sealed with the intervention of the transparent resin 101 therebetween, size reduction thereof is difficult.

Further, the semiconductor chips 110 and 120 are respectively mounted on the different lead frames 111 and 121, so that circuits for the light-emitting element and the light-receiving element cannot be integrated. This also hinders the size reduction.

Particularly in the case of the opposed type construction, it is difficult to properly position the semiconductor chips 110 and 120 respectively mounted on the different lead frames 111 and 121. That is, the positioning of the light-emitting element with respect to the light-receiving element is difficult, so that the efficiency of the coupling between the light-emitting element and the light-receiving element is likely to be reduced.

Where an attempt is made to achieve multi-channeling by providing a plurality of light-emitting element/light-receiving element pairs in a single package in either of the aforesaid constructions, there is a difficulty in optical signal isolation between respective channels. Therefore, it is impossible to realize a multi-channel device.

SUMMARY OF THE INVENTION

It is an object of the present invention to provide a semiconductor device which includes a pair of elements capable of signal transmission therebetween in an electrically isolated state.

It is another object of the invention to provide a semiconductor device which features easier positioning of a pair of elements adapted for signal transmission therebetween in an electrically isolated state.

It is further another object of the invention to provide a semiconductor device which has a construction advantageous for multi-channel signal transmission in an electrically isolated state.

The semiconductor device according to the present invention comprises: a first semiconductor chip; and a second semiconductor chip stacked on the first semiconductor chip and bonded to a surface of the first semiconductor chip. The first semiconductor chip and the second semiconductor chip are formed with a first element and a second element, respectively, which are provided in an opposed relation. The first element and the second element are adapted to be coupled to each other in an electrically isolated state for signal transmission. The first semiconductor chip has an external connector isolated from the first element and electrically connected to the second element.

The signal transmission between the first element and the second element maybe achieved through photo-coupling. Alternatively, the signal transmission between the first element and the second element may be achieved through magnetic coupling (coupling by mutual inductance). Further, one of the first element and the second element may be a signal transmitting element, and the other may be a signal receiving element. In this case, which of the first and second elements is the signal transmission element is not critical.

The first semiconductor chip and the second semiconductor chip may respectively have chip connectors, through which the connection between the second element and the external connector may be achieved. In this case, the chip connectors of the first and second semiconductor chips are preferably located in opposed positions when the first and second elements are bonded to each other in an opposed relation.

A chip interconnection member may be interposed between the chip connectors of the first and second semiconductor chips. The chip interconnection member may be a metal protuberance provided on at least one of the chip connectors of the first and second semiconductor chips. The metal protuberance may be a bump formed as a relatively thick film by plating, or a thin metal film (metal deposition film) having a thickness much smaller than the bump.

The connection between the chip connectors and the external connector may be achieved by an internal interconnection provided in the first semiconductor chip, or by a surface interconnection provided on the surface of the first semiconductor chip. Where the chip interconnection member is provided on the first semiconductor chip, the surface interconnection is preferably composed of the same material as the chip interconnection member. Thus, the formation of the surface interconnection can be achieved simultaneously with the formation of the chip interconnection member.

The semiconductor device preferably further comprises a wall member provided between the opposed surfaces of the first and second semiconductor chips as surrounding the first and second elements. Thus, a coupling space (e.g., a light transmission path for optical coupling) can assuredly be provided between the first and second elements when the first and second semiconductor chips bonded to each other are resin-sealed.

In accordance with the present invention, the semiconductor device has a so-called chip-on-chip structure in which the second semiconductor chip is bonded onto the first semiconductor chip in a stacked relation. The first element and the second element respectively provided in the first semiconductor chip and the second semiconductor chip are opposed to each other. The chip-on-chip structure makes it possible to dispose the first element and the second element in a very close relation for a higher coupling efficiency. Where the first element and the second element are to be coupled to each other by an optical signal, for example, a light transmission path can assuredly be provided between the first element and the second element without the provision of a transparent resin therebetween. Thus, an isolator having a reduced size can be realized.

The semiconductor device of chip-on-chip structure can be handled virtually as a single chip. In addition, the external connector for the second element is provided on the first semiconductor chip, so that the first semiconductor chip and the second semiconductor chip can share a single lead frame. This also allows for the size reduction of the isolator. Further, external connection of the second semiconductor chip can be achieved through the external connector provided on the first semiconductor chip, so that the external connection of the second semiconductor chip is easily achieved.

Since the second semiconductor chip is bonded onto the surface of the first semiconductorchip, the first element and the second element can more easily be positioned with respect to each other than the prior art in which two lead frames are employed.

The signal transmission element and the signal receiving element can individually be formed through proper device processes, so that an isolator having a satisfactory coupling efficiency can be realized. The isolator can be constituted, for example, by a highly efficient light-emitting element composed of a compound semiconductor and a light-receiving element composed of a silicon semiconductor. Where the first semiconductor chip is composed of a silicon semiconductor and the second semiconductor chip is composed of a compound semiconductor, for example, a required circuit can easily be formed as a silicon LSI in the first semiconductor chip.

In the first semiconductor chip, a protective circuit is preferably provided for prevention of insulation breakdown between the first element and the second element.

In the present invention, the external connector for the second element is provided on the first semiconductor chip and, hence, it is preferred to take measures against the insulation breakdown between the first element and the second element. This is why the protective circuit is provided in the first semiconductor chip for the prevention of the insulation breakdown.

It is preferred that the first semiconductor chip has an insulating film provided on a surface of a semiconductor substrate thereof, and a wiring for connection between the external connector and the second element is provided on a greatest thickness region of the insulating film. With this arrangement, the breakdown voltage between the first element and the second element can be increased thereby to effectively prevent the insulation breakdown therebetween.

The greatest thickness region of the insulating film may be a region on a field insulating film which isolates device formation regions from each other. In this case, the wiring may be provided in contact with a surface of the field oxide film or, alternatively, on a surface of an inter-layer insulating film or a surface protective film.

A circuit for the second element may be provided in the first semiconductor chip. The circuit for the second element may be a driver circuit for driving the second element.

With this arrangement, the circuit for the second element is provided in the first semiconductor chip, thereby simplifying the construction of the second semiconductor chip. Particularly, where the second semiconductor chip is composed of a compound semiconductor and the first semiconductor chip is composed of a silicon semiconductor or the like, for example, the circuit for the second element can be formed as a silicon LSI in which circuit formation is easy. This provides for a merit in a production process. Further, there is no need to provide the circuit for the second element in an external device (e.g., a different semiconductor chip) connected thereto via an external connector. Thus, the size reduction of the entire isolator can be achieved.

A function testing circuit for the second element may be provided in the first semiconductor chip.

The function testing circuit may include a signal intensity sensing element (e.g., light-receiving element) for sensing the intensity of a signal (e.g., light intensity) generated by the second element. In this case, the driver circuit for the second element may be subjected to a feed back control on the basis of an output signal of the function testing circuit, so that a signal of a required intensity can be generated from the second element to ensure satisfactory coupling between the first element and the second element.

The first element may include a plurality of first elements provided in the first semiconductor chip. The second element may include a plurality of second elements provided in the second semiconductor chip in an opposed relation with respect to the plurality of first elements.

With this arrangement, the first semiconductor chip and the second semiconductor chip are bonded to each other on the basis of the chip-on-chip structure, whereby the first element and the second element are located in a very close relation. Accordingly, the first element and the second element can be coupled to each other at a very high coupling efficiency. Where a multi-channel isolator is constructed such that the plurality of first elements and the plurality of second elements are provided in one-to-one correspondence on the first semiconductor chip and on the second semiconductor chip, respectively, inter-channel signal leakage is negligible. More specifically, where the first elements are respectively coupled to the second elements by optical signals, for example, there is no possibility of inter-channel interference of the optical signals even without provision of shielding mechanisms between channels.

In addition, the first elements can properly be positioned with respect to the corresponding second elements for the respective channels by bonding the second semiconductor chip onto the surface of the first semiconductor chip. Thus, an isolator of multi-channel structure can easily be provided.

The foregoing and other objects, features and effects of the present invention will become more apparent from the following description of the preferred embodiments with reference to the attached drawings.

DESCRIPTION OF THE PREFERRED EMBODIMENTS

Figure 1:
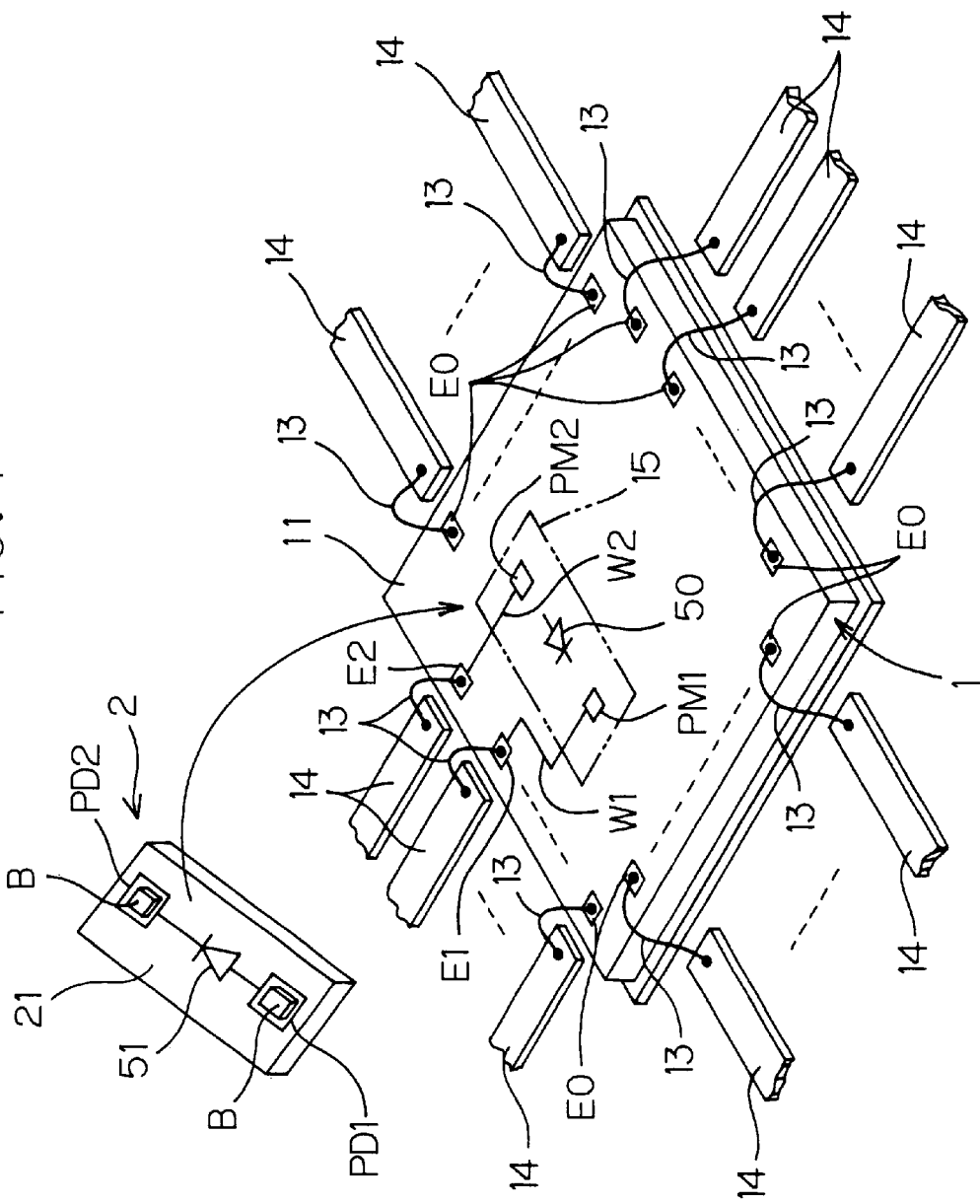
FIG. 1 is an exploded perspective view of a semiconductor device according to a first embodiment of the present invention.
Figure 2:
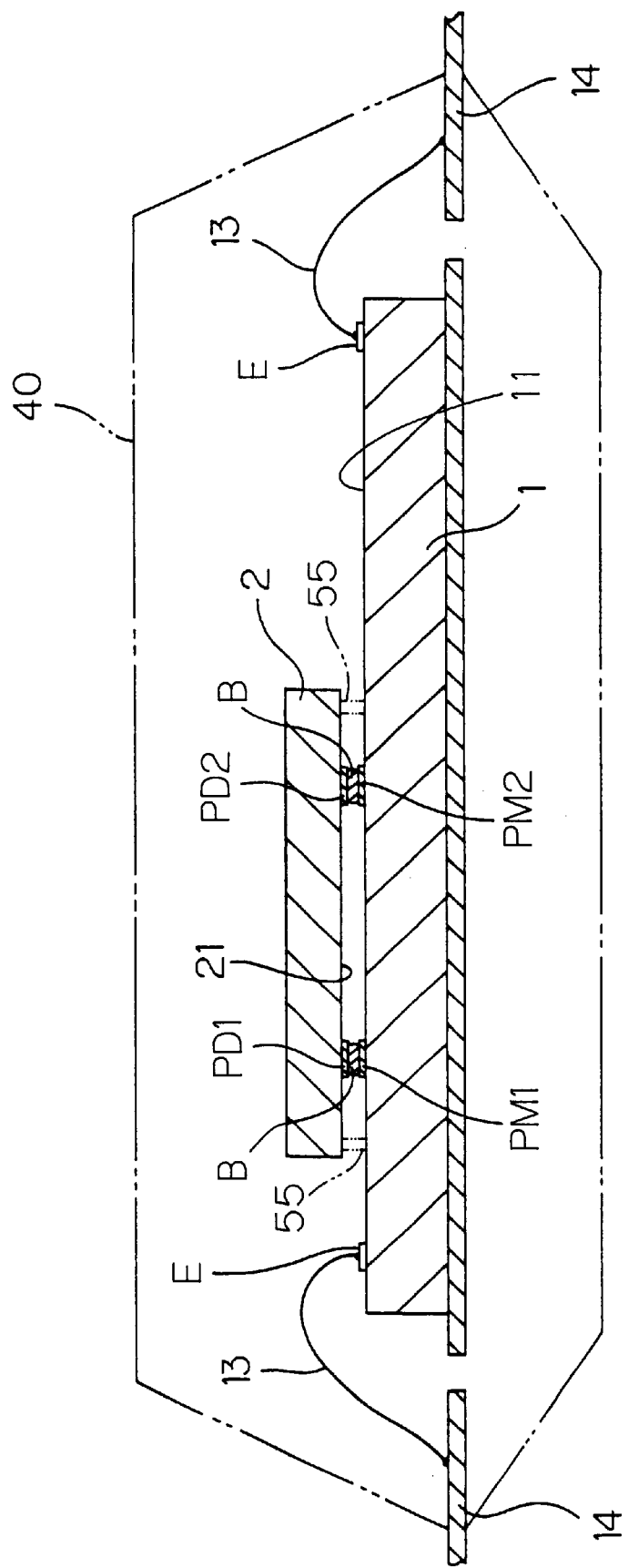
FIG. 2 is a sectional view of the semiconductor device.

FIG. 1 is an exploded perspective view of a semiconductor device according to one embodiment of the present invention, and FIG. 2 is a sectional view of the semiconductor device. The semiconductor device has a so-called chip-on-chip structure which includes a mother chip or primary chip 1 as the first semiconductor chip and a daughter chip or secondary chip 2 as the second semiconductor chip stacked on the primary chip 1 and bonded to a surface 11 of the primary chip 1. The semiconductor device of chip-on-chip structure is resin-molded to be packaged in a package 40 with a lead frame 14 extending therefrom for external connection.

The primary chip 1 is comprised, for example, of a silicon chip. The surface 11 is on an active surface layer side of a semiconductor substrate surface of the primary chip 1 where formed with are functional devices such as transistors, and the surface 11 is covered with a surface protective film of an insulative material. A plurality of pads E0, E1, E2 for external connection (which will hereinafter be referred to collectively as "external connection pads E") are provided as exposed from the surface protective film in a peripheral portion of the surface 11 of the primary chip 1 which has a generally rectangular plan shape. The external connection pads E are connected to the lead frame 14 via bonding wires 13.

The primary chip 1 has a bonding region 15, to which the secondary chip 2 is to be bonded, in an inward surface portion thereof. A light-receiving element 50 (the first element) such as a photo-diode is provided in the bonding region 15. Further, chip connection pads PM1, PM2 for connection to the secondary chip 2 (a chip connector, which will hereinafter be referred to collectively as "chip connection pads PM") are provided in the bonding region 15.

The chip connection pads PM1 and PM2 are connected to the external connection pads E1 and E2 (the external connector) via wirings W1 and W2, respectively. The wirings W1, W2 are electrically isolated from the light-receiving element 50. More specifically, the wirings W1, W2 may be internal interconnections which are provided inside the primary chip 1 and isolated from the light-receiving element 50 by an insulating film such as of silicon oxide. Alternatively, the wirings W1, W2 may be surface interconnections formed of an oxidation-resistant metal (e.g., gold, lead, platinum, silver or iridium) provided on the surface protective film.

The secondary chip 2 is comprised, for example, of a gallium-arsenide compound semiconductor chip and includes a light-emitting element 51 (the second element) which is capable of emitting light from a surface 21 thereof. The surface 21 is a semiconductor substrate surface of the secondary chip 2 on the side of an active surface region formed with a functional device such as the light-emitting element 51, and covered with a surface protective film of an insulative material. Chip connection pads PD1, PD2 for connection to the primary chip 1 (the chip connector, which will hereinafter be referred to collectively as "chip connection pads PD") are provided on the surface protective film. These chip connection pads PD are respectively connected to opposite terminals of the light-emitting element 51.

Bumps B of an oxidation-resistant metal such as gold, lead, platinum, silver or iridium are provided on the chip connection pads PD of the secondary chip 2 to form metal protuberances as the chip interconnection member.

The secondary chip 2 is bonded to the primary chip 1 with its surface 21 being opposed to the surface 11 of the primary chip 1. The bonding is achieved bypress-bonding the primary chip 1 and the secondary chip 2 to each other with the bumps B abutting against the chip connection pads PM in the bonding region 15. In the press-bonding, ultrasonic vibrations are applied to the primary chip 1 and/or the secondary chip 2, as required. Thus, the bumps B are assuredly bonded to the chip connection pads PM.

With the primary chip 1 and the secondary chip 2 being bonded to each other via the chip connection pads PM, PD and bumps B, the light-receiving element 50 of the primary chip 1 and the light-emitting element 51 of the secondary chip 2 are opposed to each other in a very close relation to form a photo-coupler which is one kind of isolators. The light-emitting element 51 and the light-receiving element 50 are spaced a very small distance from each other, so that the coupling efficiency is extremely high.

Since the distance between the surfaces of the primary chip 1 and the secondary chip 2 is very small, a mold resin does not block the light path between the light-emitting element 51 and the light-receiving element 50. In order to assuredly provide the light path, a peripheral wall member 55 (the wall member) may be provided, for example, along the entire peripheral portion of the surface 21 of the secondary chip 2 as indicated by a two-dot-and-dash line in FIG. 2.

Figure 3:
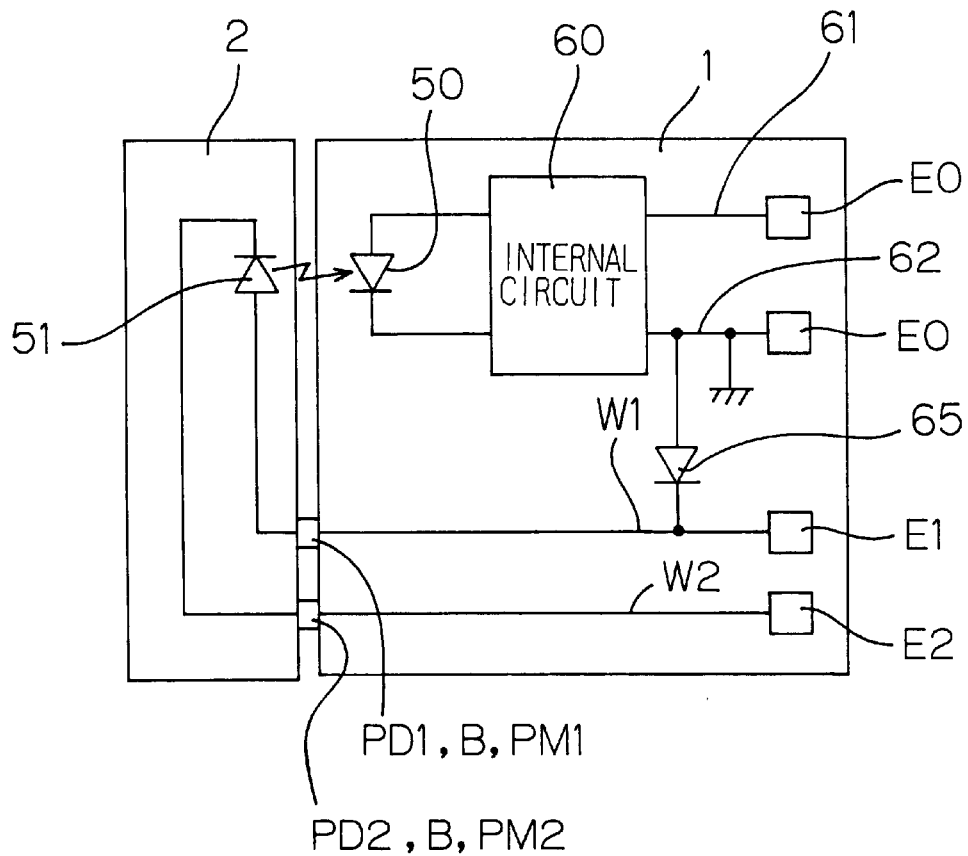
FIG. 3 is a block diagram for explaining the electrical construction of the semiconductor device.

FIG. 3 is a block diagram for explaining the electrical construction of the semiconductor device. The light-receiving element 50 and an internal circuit 60 for detecting an output signal of the light-receiving element 50 are provided in the primary chip 1, and the internal circuit 60 is connected to the external connection pads E0 via the wirings 61, 62. The light-emitting element 51 in the secondary chip 2 is connected to the wirings W1, W2 provided in the primary chip 1 via the chip connection pads PD, PM and bumps B thereby to be connected to the external connection pads E1, E2 provided on the surface 11 of the primary chip 1.

The wirings W1, W2 are electrically isolated from components relevant to the light-receiving element 50 as described above, but provided in the chip formed with the light-receiving element 50. Accordingly, there is a need to take measures against insulation breakdown between the light-emitting element 51 and the light-receiving element 50. In this embodiment, therefore, a diode 65 (having an anode on the side of the wiring 62) which constitutes the protective circuit is connected between the wiring W1 on the side of the light-emitting element 51 and the wiring 62 connected to the ground on the side of the light-receiving element 51. Thus, even if a surge voltage is applied to the external connection pad E1, the surge voltage can be released to be reduced to a reference potential of the primary chip 1 via the diode 65. Therefore, the breakdown of an electrically insulating structure between the light-emitting element 51 and the light-receiving element 50 can be prevented.

The protection circuit may be constituted by a plurality of diodes connected in series with their cathodes connected to the side of the wiring 62 and with their anodes connected to the side of the wiring W1. Alternatively, the protection circuit may be constituted by a Zener diode having a cathode connected to the wiring W1 and an anode connected to the wiring 62.

Figure 4:
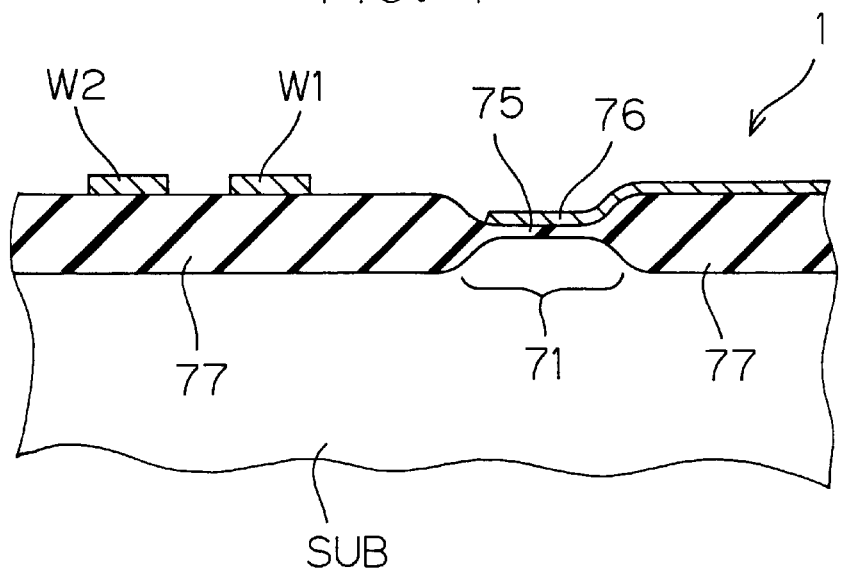
FIG. 4 is a sectional view for explaining location of wirings for a light-emitting element.

FIG. 4 is a sectional view for explaining the location of the wirings W1, W2. A semiconductor substrate SUB as a base body of the primary chip 1 has a plurality of device formation regions 71 which are isolated from each other by a field oxide film 77. A functional device, e.g., a MOS transistor, is provided in the device formation region 71 with its gate electrode 76 provided on the semiconductor substrate SUB with the intervention of a thin gate insulating film 75.

The wirings W1, W2 are provided on the field oxide film 77 which is a portion of an insulating film having the greatest thickness on the semiconductor substrate SUB. Thus, a sufficiently high breakdown voltage between the wirings W1, W2 and the semiconductor substrate SUB can be ensured. Thus, the breakdown voltage between the light-emitting element 51 and the light-receiving element 50 can be increased.

Though not shown in FIG. 4, an inter-layer insulting film and the aforesaid surface protective film are provided on the field oxide film 77. Where the wirings W1, W2 are provided as surface interconnections on the surface protective film, the wirings W1, W2 are preferably located above the field oxide film 77.

In accordance with this embodiment, the light-receiving element 50 and the light-emitting element 51 are respectively provided in the primary chip 1 and the secondary chip 2 which are bonded to each other on a chip-on-chip basis. Thus, these elements are opposed to each other in a very close relation. Accordingly, these elements can be coupled to each other at an extremely high coupling efficiency without the use of a transparent resin or the like. Further, the primary chip 1 and the secondary chip 2 can be handled virtually as a single chip and, in addition, the external connectors E1, E2 for the secondary chip 2 are provided on the primary chip 1. Therefore, the primary chip 1 and the secondary chip 2 share the lead frame 14. As a result, the size of the photo-coupler can be reduced as compared with the prior art.

Since the positioning of the light-receiving element 50 and the light-emitting element 51 can be achieved simultaneously with the bonding of the secondary chip 2 to the primary chip 1, the positioning of these elements with respect to each other can advantageously be facilitated.

Figure 5:
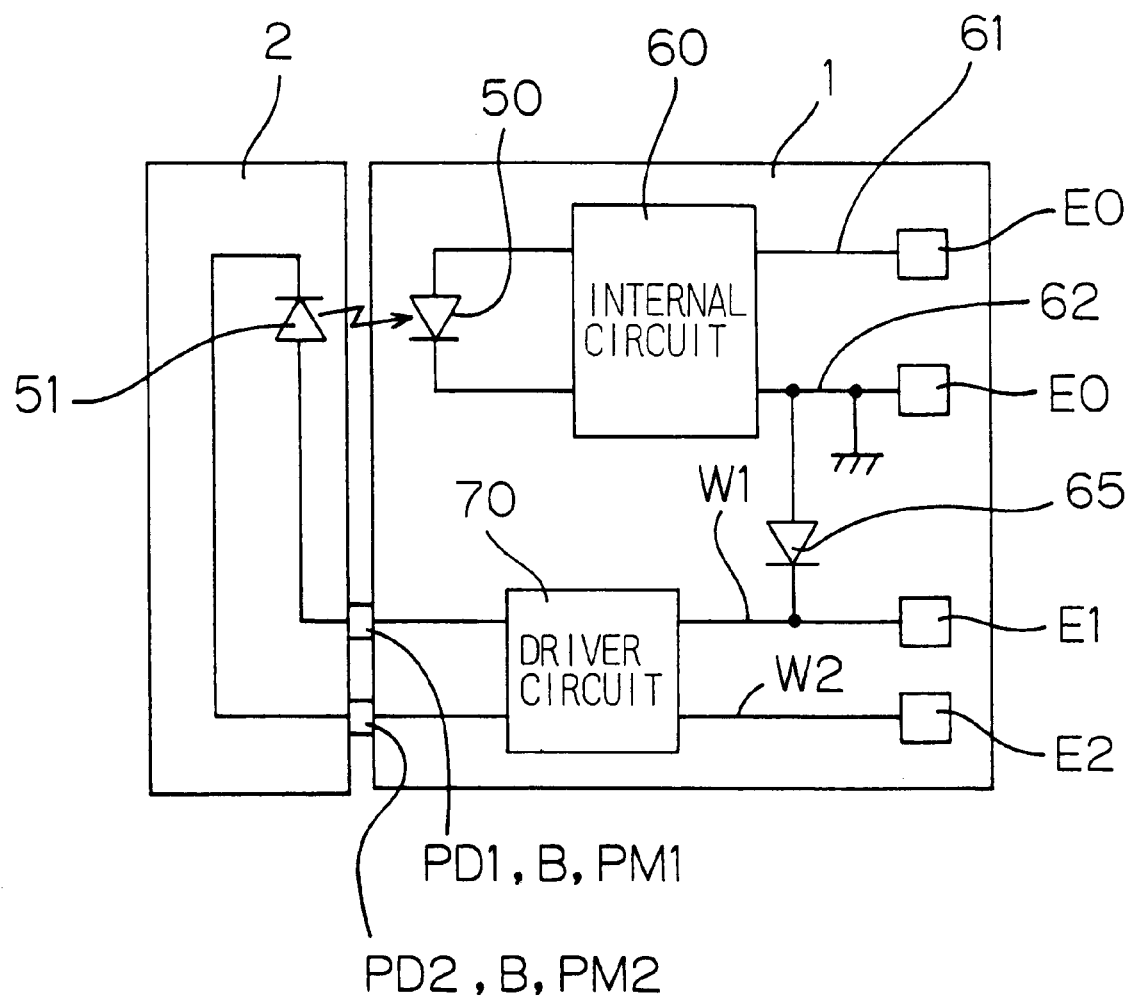
FIG. 5 is a block diagram for explaining the construction of a semiconductor device according to a second embodiment of the present invention.

FIG. 5 is a block diagram for explaining the construction of a semiconductor device according to a second embodiment of the present invention. In FIG. 5, components corresponding to the components illustrated in FIG. 3 are denoted by the same reference characters as in FIG. 3. A reference is made again to FIGS. 1, 2 and 4.

In this embodiment, the primary chip 1 is provided with a driver circuit 70 for driving the light-emitting element 51, and the chip connection pads PM of the primary chip 1 are connected to the driver circuit 70. Further, the external connection pads E1 and E2 for the light-emitting element 51 are connected to the driver circuit 70 via the wirings W1 and W2, respectively. The other arrangements are the same as in the first embodiment described above.

Formation of a circuit in the secondary chip 2 comprised of the gallium-arsenide compound semiconductor chip is relatively difficult, while formation of a circuit in the primary chip 1 comprised of the silicon chip is relatively easy. For this reason, the driver circuit 70 for the light-emitting element 51 is formed in the primary chip 1 in this embodiment. In the case of the construction shown in FIG. 3, for example, an external driver circuit is connected to the external connection pads E1, E2. In this second embodiment, on the contrary, the driver circuit 70 is also incorporated in the device. Thus, the size of a system utilizing the photo-coupler can further be reduced.

Figure 6:
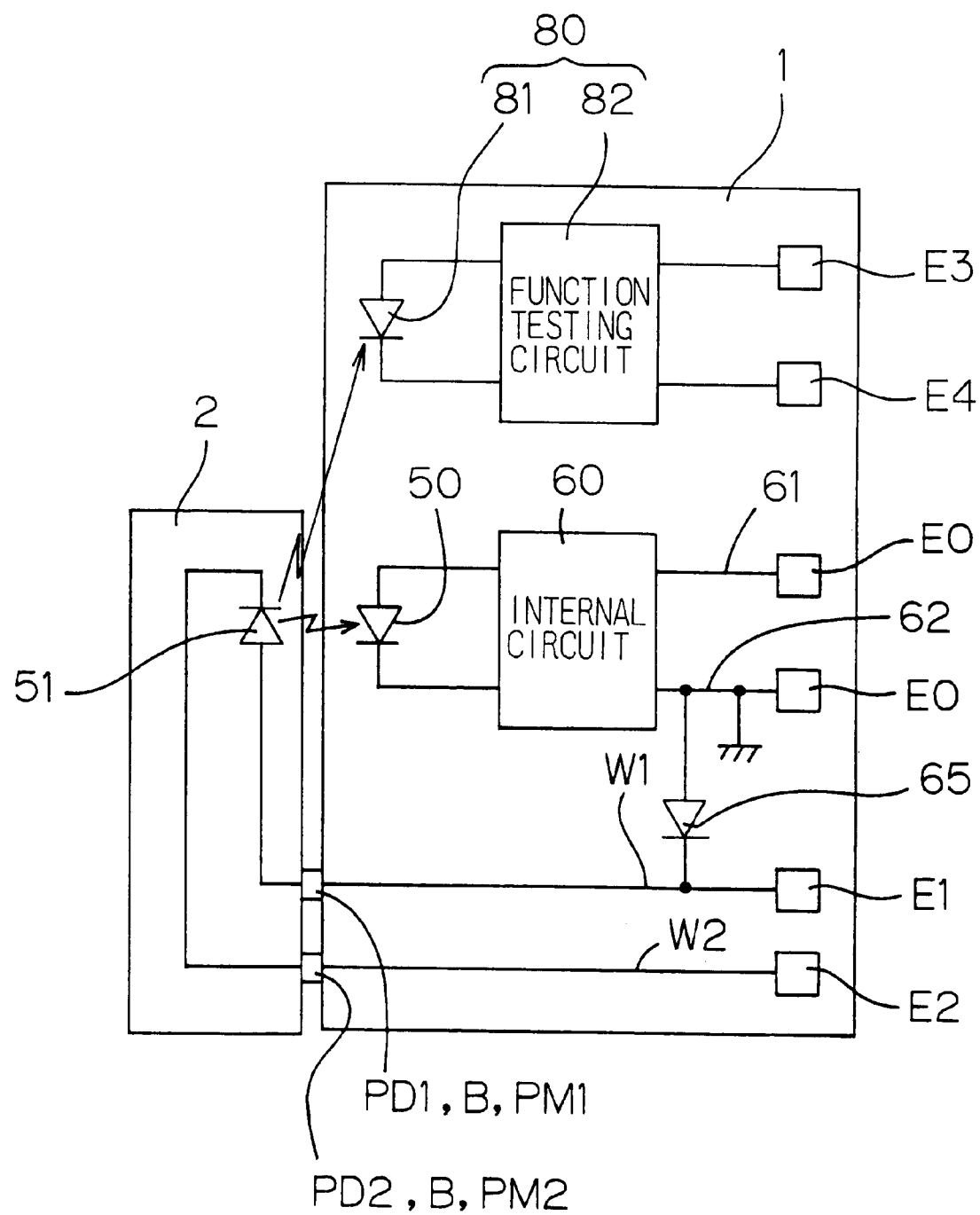
FIG. 6 is a block diagram for explaining the construction of a semiconductor device according to a third embodiment of the present invention.

FIG. 6 is a block diagram for explaining the construction of a semiconductor device according to a third embodiment of the present invention. In FIG. 6, components corresponding to the components illustrated in FIG. 3 are denoted by the same reference characters as in FIG. 3. A reference is made again to FIGS. 1, 2 and 4.

In this embodiment, a function testing circuit 80 for monitoring a function (more specifically, the amount of generated light) of the light-emitting element 51 in the secondary chip 2 is provided in the primary chip 1. The other arrangements are the same as in the first embodiment described above.

The function testing circuit 80 has a light-receiving element 81 disposed in position for receiving light from the light-emitting element 51, and a detection circuit 82 for detecting an output signal of the light-receiving element 81. The detection circuit 82 outputs signals which depend upon the amount of the light received by the light-receiving element 81. The output signals are taken out of the device via external connection pads E3, E4.

The light-emitting element 51 in the secondary chip 2 bonded to the primary chip 1 does not always have a constant light emitting efficiency. Therefore, the output signals derived from the external connection pads E3, E4 are monitored, and proper driving signals which depend upon the levels of the output signals are applied to the light-emitting element 51 from the external connection pads E1, E2 thereby to cause the light-emitting element 51 to emit a proper amount of light.

This embodiment may be employed in combination with the second embodiment. In this case, the driver circuit for the light-emitting element 51 is incorporated in the primary chip 1. Therefore, the output signals of the detection circuit 82 are not taken out of the device, but the driver circuit may be subjected to a feed back control on the basis of the output signals thereby to cause the light-emitting element 51 to generate an optical signal of a constant light amount.

Figure 7:
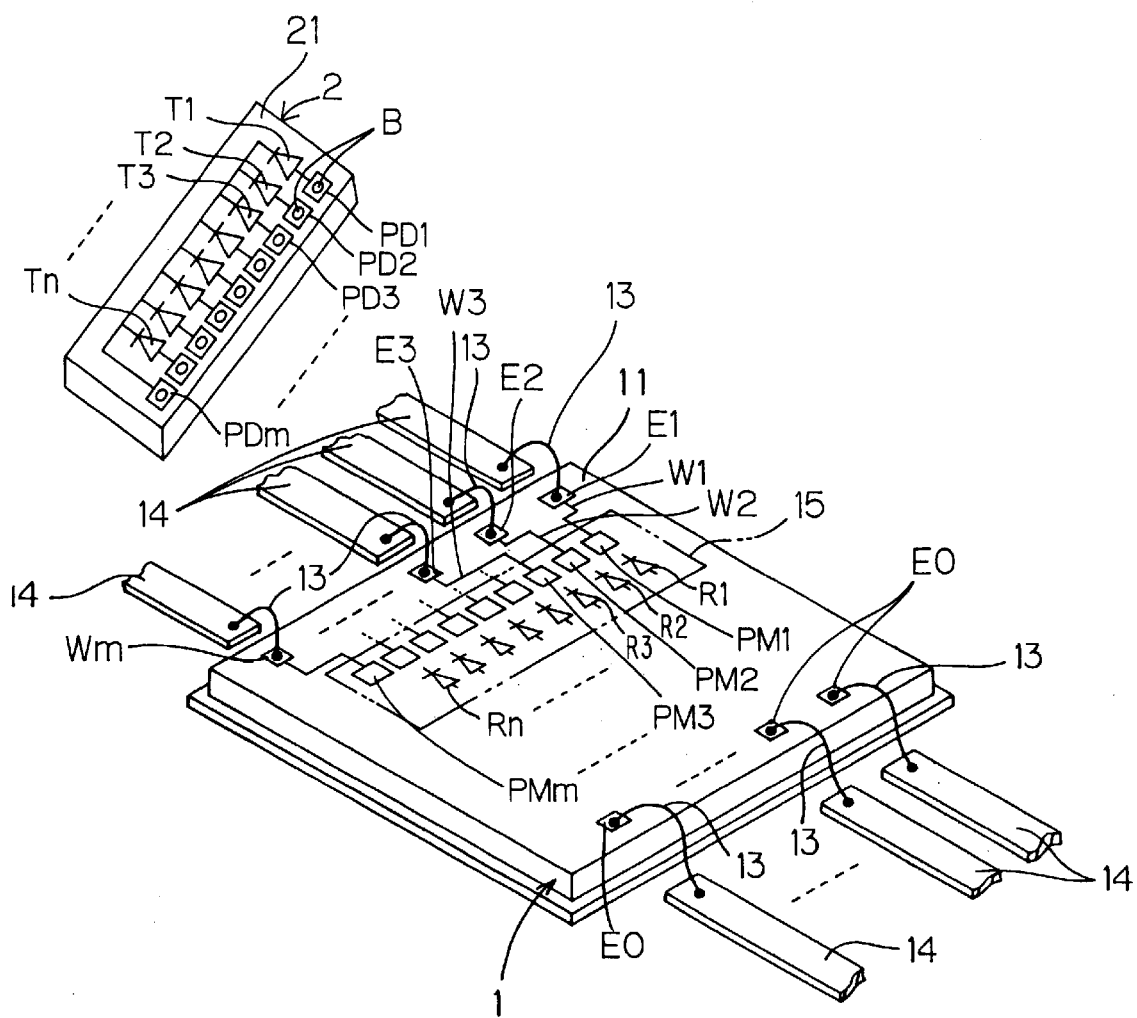
FIG. 7 is an exploded perspective view for explaining the construction of a semiconductor device according to a fourth embodiment of the present invention.
Figure 8:
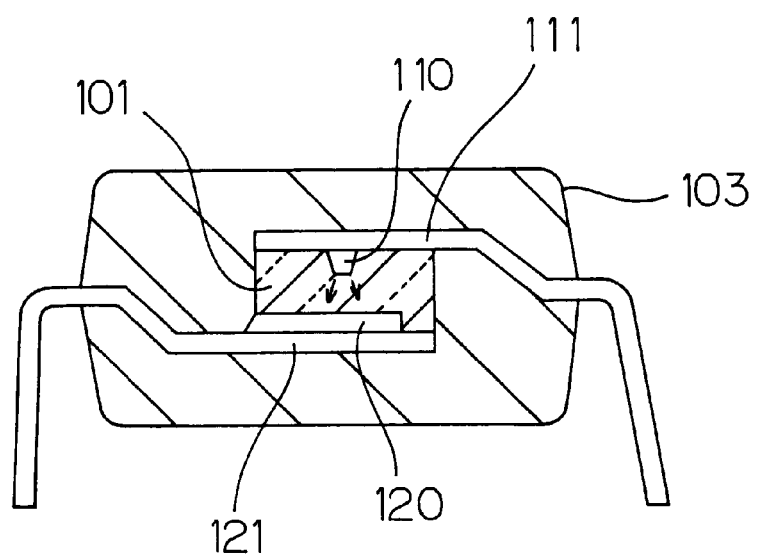
FIG. 8 is a sectional view illustrating the construction of a conventional photo-coupler of opposed type.
Figure 9:
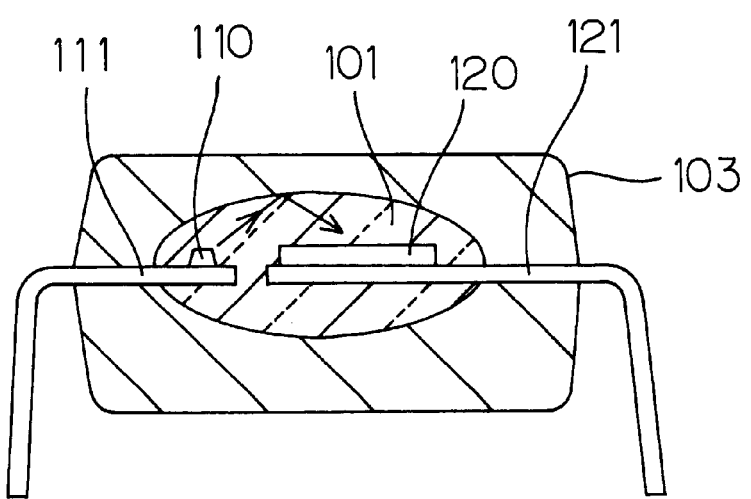
FIG. 9 is a sectional view illustrating the construction of a conventional photo-coupler of planar type.

FIG. 7 is an exploded perspective view for explaining the construction of a semiconductor device according to a fourth embodiment of the present invention. In FIG. 7, components corresponding to the components illustrated in FIG. 1 are denoted by the same reference characters as in FIG. 1.

In this embodiment, there is provided a multi-channel photo-coupler having n channels (n: a natural number not smaller than two). More specifically, the primary chip 1 includes n light-receiving elements R, R2, . . . , Rn provided in parallel in the bonding region 15 which is to be bonded to the secondary chip 2. The secondary chip 2 includes n light-emitting elements T1, T2, . . . , Tn provided in parallel and each adapted to emit light from the surface 21. On the surface 21 of the secondary chip 2, m chip connection pads PD1, PD2, . . . , PDm (m: a natural number) are provided to which driving signals are inputted to respectively drive the light-emitting elements T1 to Tn for light emission. Bumps B are provided on the surfaces of the respective chip connection pads PD1 to PDm.

Chip connection pads PM1, PM2, . . . , PMm are provided in positions corresponding to the positions of the chip connection pads PD1, PD2, . . . , PDm on the surface 11 of the primary chip 1. The chip connection pads PM1, PM2, . . . , PMm are connected to external connection pads E1, E2, . . . , Em via wirings W1, W2, . . . , Wm, respectively, which are electrically isolated from the internal circuit of the primary chip 1. The external connection pads E1 to Em are respectively connected to the lead frame 14 via the bonding wires 13. The wirings W1 to Wm may have the same construction as the wirings W1, W2 in the first embodiment described above.

The bonding of the secondary chip 2 onto the surface 11 of the primary chip 1 is achieved by bonding the bumps B to the chip connection pads PM1 to PMm. Thus, a semiconductor device of chip-on-chip structure is provided. With the primary chip 1 being bonded to the secondary chip 2, the light-emitting elements T1 to Tn are respectively opposed to the light-receiving elements R1 to Rn, so as to be coupled to the light-receiving elements R1 to Rn by optical signals.

In this case, the light-emitting elements T1 to Tn are spaced a very small distance from the light-receiving elements R1 to Rn in an opposed relation, so that the light-emitting elements can respectively be coupled to the light-receiving elements at an extremely high coupling efficiency. Therefore, the inter-channel signal interference can be prevented even without providing a special shielding mechanism between the adjacent channels.

Thus, the multi-channel photo-coupler can be provided with a simplified construction.

This embodiment may also be employed in combination with any of the first to third embodiments.

While the four embodiments of the present invention have thus been describe, the invention may be embodied in any other ways. Although the light-receiving elements 50 or R1 to Rn are provided in the primary chip 1 and the light-emitting elements 51 or T1 to Tn are provided in the secondary chip 2 in the aforesaid embodiments, the light-emitting elements may be provided in the primary chip 1 and the light-receiving elements may be provided in the secondary chip 2.

The aforesaid embodiments are directed to the isolators which are adapted for signal transmission by photo-coupling, isolators adapted for signal transmission by magnetic coupling (coupling by mutual inductance) can be constructed in substantially the same manner as in the aforesaid embodiments.

In the aforesaid embodiments, the secondary chip 2 is provided with the bumps B. Similarly, the primary chip 1 may be provided with bumps. In this case the bonding between the primary chip 1 and the secondary chip 2 on a chip-on-chip basis may be achieved by bonding the bumps provided on the primary chip 1 and on the secondary chip 2.

Further, thin metal films such as metal deposition films may be employed instead of the bumps which are generally formed by electroplating or electroless plating, since the metal protuberances for bonding the secondary chip 2 to the primary chip 1 need not have a great height.

Although an explanation has been given to a case where the single secondary chip 2 is bonded on the surface 11 of the primary chip 1 in the aforesaid embodiments, two or more secondary chips may be bonded on the surface 11 of the primary chip 1.

In the aforesaid embodiments, the primary chip 1 and the secondary chip 2 are composed of a silicon semiconductor and a gallium-arsenide compound semiconductor, respectively. However, the two semiconductor chips to be bonded to each other may be composed of any semiconductor materials such as a silicon semiconductor, a gallium-arsenide compound semiconductor and a germanium semiconductor. In this case, the semiconductor materials for the plural semiconductor chips to be bonded to each other may be either the same or different.

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims.

This application claims priority benefits under 35 USC Section 119 on the basis of Japanese Patent Application No. 11-31711 filed to the Japanese Patent Office on Feb. 9, 1999, the disclosure thereof being incorporated herein by reference.

What is claimed is:

1. A semiconductor device, comprising:
   a first semiconductor chip; and
   a second semiconductor chip stacked on the first semiconductor chip and bonded to a surface of the first semiconductor chip;
   the first semiconductor chip and the second semiconductor chip being formed with a first element and a second element, respectively, which are provided in an opposed relation, the first element and the second element being adapted to be coupled to each other in an electrically isolated state for signal transmission;
   the first semiconductor chip having an external connector isolated from the first-element and electrically connected to the second element.

2. A semiconductor device as set forth in claim 1, wherein the first semiconductor chip and the second semiconductor chip respectively have chip connectors, and the second element and the external connector are connected to each other via the chip connectors.

3. A semiconductor device as set forth in claim 2, wherein a chip interconnection member is interposed between the chip connectors of the first and second semiconductor chips.

4. A semiconductor device as set forth in claim 2, wherein the chip connectors are connected to the external connector via an internal interconnection provided in the first semiconductor chip.

5. A semiconductor device as set forth in claim 2, wherein the chip connectors are connected to the external connector via a surface interconnection provided on the surface of the first semiconductor chip.

6. A semiconductor device as set forth in claim 1, further comprising a wall member provided between opposed surfaces of the first and second semiconductor chips as surrounding the first and second elements.

7. A semiconductor device as set forth in claim 1, wherein the first semiconductor chip having a protective circuit for prevention of insulation breakdown between the first element and the second element.

8. A semiconductor device as set forth in claim 1, wherein the first semiconductor chip has an insulating film provided on a surface of a semiconductor substrate thereof, and a wiring for connection between the external connector and the second element is provided on a greatest thickness region of the insulating film.

9. A semiconductor device as set forth in claim 1, wherein the first semiconductor chip has a field insulating film provided on a surface of a semiconductor substrate thereof, and a wiring for connection between the external connector and the second element is provided above the field insulating film.

10. A semiconductor device as set forth in claim 1, wherein the first semiconductor chip being formed with a circuit for the second element.

11. A semiconductor device as set forth in claim 1, wherein the first semiconductor chip being formed with a driver circuit for driving the second element.

12. A semiconductor device as set forth in claim 1, wherein the first semiconductor chip being formed with a function testing circuit for the second element.

13. A semiconductor device as set forth in claim 12, wherein the second element is an element which generates a signal, and the function testing circuit includes a signal intensity sensing element for sensing an intensity of the signal generated by the second element.

14. A semiconductor device as set forth in claim 1, wherein the external connector is electrically connected to a lead frame, and the first and the second semiconductor chips share the lead frame.

15. A semiconductor device as set forth in claim 1, wherein the first semiconductor chip and the second semiconductor chip respectively include semiconductor substrates composed of different semiconductor materials.

16. A semiconductor device as set forth in claim 1, wherein the first element includes a plurality of first elements provided in the first semiconductor chip, and the second element includes a plurality of second elements provided in the second semiconductor chip in a respective opposed relation with respect to the plurality of first elements.

* * * * *